United States Patent [19]
East

[11] Patent Number: 5,841,334
[45] Date of Patent: Nov. 24, 1998

[54] RF CAPACITOR CIRCUIT AND METHOD OF ELECTRONICALLY TUNING SAME

[75] Inventor: Allen M. East, Romford, England

[73] Assignee: Ericsson Inc., Research Triangle Park, N.C.

[21] Appl. No.: 773,747

[22] Filed: Dec. 24, 1996

[51] Int. Cl.⁶ .................................................. H03J 5/24
[52] U.S. Cl. ..................... 334/55; 361/275.2; 361/329
[58] Field of Search .................. 334/55, 83; 361/17, 361/104, 275.1, 275.2, 275.4, 280–282, 328, 329, 275.3

[56] References Cited

U.S. PATENT DOCUMENTS

| | | | |
|---|---|---|---|
| 1,937,099 | 11/1933 | Stewart | 334/55 X |
| 3,231,701 | 1/1966 | Craig | 361/17 X |
| 4,216,451 | 8/1980 | Nishimura et al. | 334/55 X |
| 4,442,473 | 4/1984 | Holtzmann et al. | 361/275 |
| 4,890,063 | 12/1989 | Haragashira | 334/55 X |
| 5,473,291 | 12/1995 | Brownley | 334/55 X |

FOREIGN PATENT DOCUMENTS

| | | |
|---|---|---|
| 3910165 A1 | 10/1990 | Germany . |
| G 94 04 638.1 | 7/1994 | Germany . |
| 63043740 | 8/1989 | Japan . |
| 04063502 | 10/1993 | Japan . |

*Primary Examiner*—Paul Gensler
*Attorney, Agent, or Firm*—James P. Davidson

[57] ABSTRACT

An RF capacitor circuit having a plurality of capacitors and a method of electronically tuning such circuit is disclosed. The method includes the steps of connecting the capacitors in parallel relation so as to have common nodes and electronically eliminating any number of the capacitors in order to obtain a desired total capacitance for the circuit. The method further includes either connecting a fuse in series relation with each capacitor, wherein each fuse has a designated current rating above which it prevents current from passing to its associated capacitor, or providing each capacitor with a unique breakdown voltage/current. Thus, when a voltage is provided to an input of the circuit, either the current rating of a designated number of fuses or the breakdown voltage/current of a designated number of capacitors is exceeded. Such capacitors are then electronically eliminated and the circuit is tuned to the desired total capacitance. It is preferred that the current rating of the fuses or the breakdown voltage/current of the capacitors range from a minimum value to a maximum value.

20 Claims, 1 Drawing Sheet

RF CAPACITOR CIRCUIT AND METHOD OF ELECTRONICALLY TUNING SAME

BACKGROUND OF THE INVENTION

1. Field of the Invention

The present invention relates generally to RF capacitor circuits utilized in communication devices and, in particular, to a method of electronically tuning an RF capacitor circuit for use in a portable phone.

2. Description of Related Art

Portable cellular phones are well known and have been utilized for the past several years. Such cellular phones typically include certain RF circuits therein (voltage controlled oscillators and filters, for example) which include capacitor elements. Due to the tolerances permitted for other elements throughout the cellular phone, it has been imperative that at least some of these RF circuits be tuned so as to compensate for such discrepancies so that signals received remain within an acceptable frequency range.

In the past, manual adjustment of a tunable capacitor circuit was made during production. This practice was replaced by the use of close tolerance components or pre-tuned modules since the need for high speed production outweighed the additional cost of such components at that time. Today, however, radio communications products are under extreme cost pressure and component cost is once again an important issue. Therefore, tunable components are returning to RF circuits. One technique utilized for tuning such components is laser trimming, but while this approach is able to perform the task in an acceptable manner, it also involves a heavy expenditure of capital.

In light of the foregoing, a primary objective of the present invention is to provide a capacitor circuit and a method of electronically tuning such capacitor circuit to a desired capacitance for use in an RF device.

Another object of the present invention is to provide a capacitor circuit and a method of electronically tuning such capacitor circuit which is cost efficient.

A further object of the present invention is to provide a capacitor circuit and a method of electronically tuning such capacitor circuit in a high speed production environment.

Yet another object of the present invention is to provide an electronically tunable capacitor circuit for use in an RF device in which certain capacitors are eliminated so that the capacitor circuit has a desired total capacitance.

Still another object of the present invention is to provide an electronically tunable capacitor circuit in which the individual capacitors therein have a unique breakdown voltage or current.

Another object of the present invention is to provide an electronically tunable capacitor circuit in which the individual capacitors therein are each in series with a fuse having a designated current rating.

These objects and other features of the present invention will become more readily apparent upon reference to the following description when taken in conjunction with following drawing.

SUMMARY OF THE INVENTION

In accordance with one aspect of the present invention, a method of electronically tuning a circuit having a plurality of capacitors includes the steps of connecting the capacitors in parallel relation so as to have common nodes and electronically eliminating any number of the capacitors in order to obtain a desired total capacitance for the circuit. The method further includes either connecting a fuse in series relation with each capacitor, wherein each fuse has a designated current rating above which it prevents current from passing to its associated capacitor, or providing each capacitor with a unique breakdown voltage/current. Thus, when a voltage is provided to an input of the circuit which applies a current exceeding the current rating of a designated number of fuses or the breakdown voltage/current of a designated number of capacitors, such capacitors are electronically eliminated and the circuit is tuned to the desired total capacitance. The current rating of the fuses or the breakdown voltage/current of the capacitors progressively increase from a minimum value to a maximum value.

In accordance with a second aspect of the present invention, a tuned RF capacitor circuit is disclosed as including a plurality of capacitors connected in parallel relation with common nodes, wherein any number of such capacitors may be electronically eliminated from the circuit in order to give the circuit a desired total capacitance. The capacitors in the circuit either have a unique breakdown voltage/current or have a fuse with a designated current rating connected in series relation therewith.

BRIEF DESCRIPTION OF THE DRAWING

While the specification concludes with claims particularly pointing out and distinctly claiming the present invention, it is believed the same will be better understood from the following description taken in conjunction with the accompanying drawing in which:

DETAILED DESCRIPTION OF THE INVENTION

Figure 1:
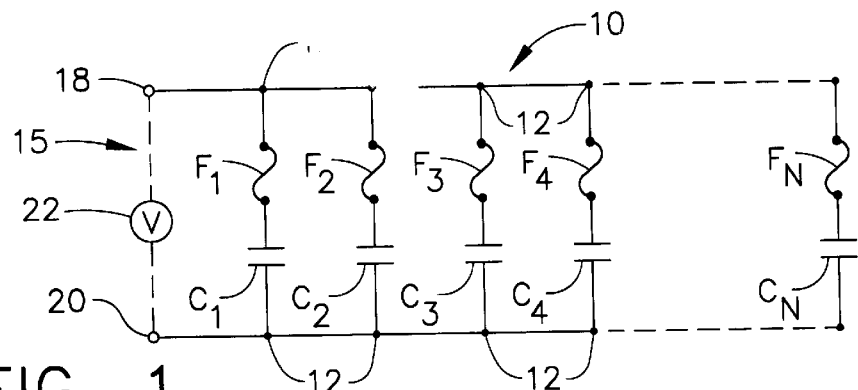
FIG. 1 is a circuit diagram of an electronically tunable capacitor circuit in accordance with the present invention.

Referring now to the drawing in detail, wherein identical numerals indicate the same elements throughout the figures, FIG. 1 depicts a circuit 10 including a plurality of capacitors C connected in parallel so as to have common nodes 12. The number of capacitors provided in circuit 10 range from a first capacitor $C_1$ to any given number $C_N$. It will be understood that the total capacitance of circuit 10 is the addition of all the capacitors (e.g., $C_{total} = C_1 + C_2 + C_3 + C_4 + C_N$). Capacitors C may have the same capacitance, be scaled from higher capacitance to lower capacitance (or vice versa), or otherwise have varied capacitance depending on the use and requirements of circuit 10.

It will be seen in FIG. 1 that each capacitor C has connected in series therewith a fuse F (ranging in number from $F_1$ to $F_N$) having a designated current rating. The designated current rating for each fuse F is unique, ranging from a minimum current rating to a maximum current rating (e.g., the current rating for fuse $F_2$ is greater than the current rating for fuse $F_1$, the current rating for fuse $F_3$ is greater than the current rating for fuse $F_2$, etc.). In this way, it will be understood that any number of capacitors C may be electronically eliminated from or "tuned out" of circuit 10 by providing a programming voltage (through a voltage source 22) to circuit input 15 so that the current rating of one or more fuses F is met (thereby creating an open circuit between the respective nodes 12 of circuit 10 having that particular fuse and capacitor therebetween). Thus, the total capacitance $C_{total}$ of circuit 10 is lowered by the capacitors C electronically eliminated from circuit 10 by the application of the voltage (and is therefore a function of the remaining capacitors). It will be understood that the adjustment of total capacitance $C_{total}$ may be made only once for each circuit 10 since there is no way to reconnect those capacitors C associated with fuses F whose current rating has been exceeded.

Figure 3A:
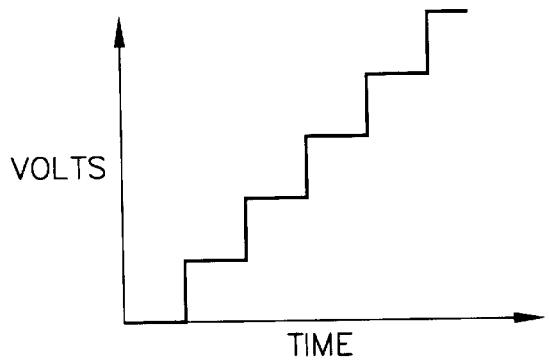
FIG. 3A is a schematic diagram of a Direct Current programming voltage which may be applied to the circuit depicted in FIG. 1 according to the method of the present invention.
Figure 3B:
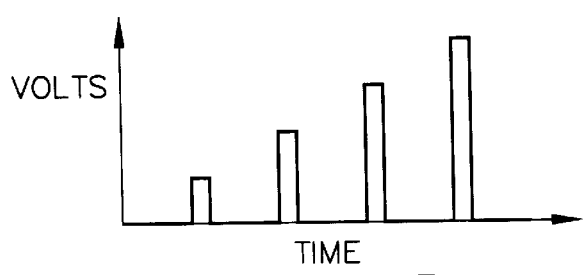
FIG. 3B is a schematic diagram of a pulsed programming voltage which may be applied to the circuits depicted in FIGS. 1 and 2 according to the method of the present invention.
Figure 3C:
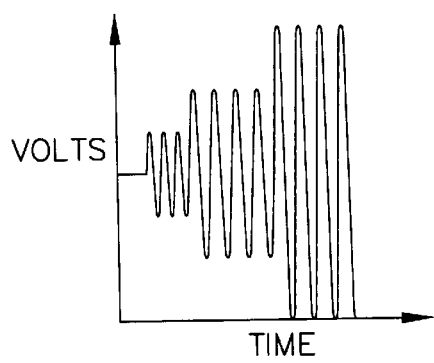
FIG. 3C is a schematic diagram of an RF programming voltage which may be applied to the circuits depicted in FIGS. 1 and 2 according to the method of the present invention.

The voltages supplied to circuit input 15 may, as evidenced in FIGS. 3B–3C, take the form of pulsed, or RF. It will further be seen that the voltages shown preferably increase over time (or are stepped) so that the current rating of more fuses F is met the longer such voltage is provided to circuit 10, and thus more capacitors C are electronically eliminated from (tuned out of) circuit 10.

Figure 2:
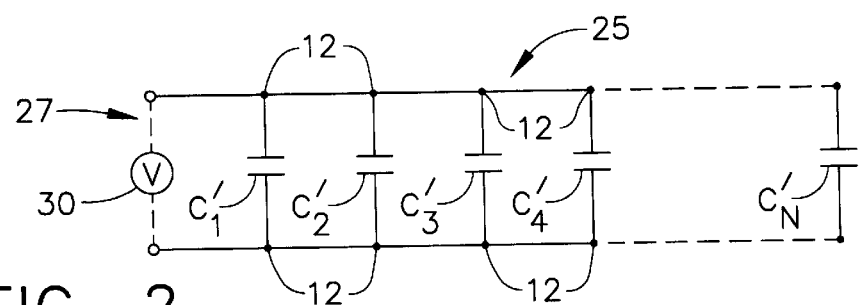
FIG. 2 is a circuit diagram of a second electronically tunable capacitor circuit in accordance with the present invention.

An alternative circuit 25 is depicted in FIG. 2 which also includes a plurality of capacitors C' connected in parallel relation. Instead of implementing fuses F as in circuit 10 discussed above, it will be understood that capacitors C' are of a type which have a designated breakdown voltage or current. By this it is meant that each individual capacitor C' is broken down and an open circuit created thereacross (i.e., effectively removed from circuit 25) when it experiences a voltage or current greater than the particular breakdown voltage or current inherent to that particular component. Other than the substitution of capacitors C' for the combination of capacitors C and fuses F, however, the process for electronically tuning circuit 25 is the same as that described with respect to circuit 10. Thus, the voltages supplied to input 27 of circuit 25, such as by a voltage source 30, act to eliminate certain ones of capacitors C' and thus reduce the total capacitance $C_{total}$ of circuit 25. In fact, certain known capacitors C' even have a DC breakdown voltage characteristic for a given steady state DC voltage or one which increases over time as shown in FIG. 3A.

Generally speaking, it is preferred that the individual capacitors C and C' of circuits 10 and 25 either be completely included or completely eliminated in order to better obtain the desired total capacitance $C_{total}$ therefor. Nevertheless, it will be appreciated that a resistor of some nominal value may be connected in series with fuses F of circuit 10 or capacitors C' of circuit 25. By so doing, it is possible that only a portion of such capacitor C or C' will be electronically eliminated from its respective circuit 10 or 25.

It will be understood that circuits 10 and 25 may be constructed by any number of techniques, including, but not limited to, thin film technology, thick film technology, discrete components, and integrated monolithic structures. It is also foreseen that circuits 10 and 25 may be incorporated into packages having a variety of sizes. These include what is known as an "0805" package (a surface-mounted component having the dimensions of eighty-thousandths ($^{80}/_{1000}$) of an inch by fifty-thousandths ($^{50}/_{1000}$) of an inch), a "0603" package (a surface-mounted component having the dimensions of sixty-thousandths ($^{60}/_{1000}$) of an inch by thirty-thousandths ($^{30}/_{1000}$) of an inch), and a "0402" package (a surface-mounted component having the dimensions of forty-thousandths ($^{40}/_{1000}$) of an inch by twenty-thousandths ($^{20}/_{1000}$) of an inch).

Having shown and described the preferred embodiment of the present invention, further adaptations of the RF capacitor circuit and the method of electronically tuning such RF capacitor circuit can be accomplished by appropriate modifications by one of ordinary skill in the art without departing from the scope of the invention.

| PARTS LIST | |
|---|---|
| 10 | circuit (generally) |
| 12 | nodes of circuit |
| 15 | circuit input |
| 18 | terminal of circuit input |
| 20 | terminal of circuit input |
| 22 | voltage source |
| 25 | alternative circuit (generally) |
| 27 | alternative circuit input |
| 30 | alternative circuit voltage source |
| C | capacitor |
| F | fuse |
| C' | capacitor having unique breakdown voltage/current |
| $C_{total}$ | total capacitance |

What is claimed is:

1. A method of electronically tuning a capacitor circuit having a plurality of capacitors connected in parallel relation so that a desired total capacitance for said capacitor circuit is attained, comprising the following steps:

(a) connecting a fuse in series relation with each said capacitor, wherein each said fuse has a designated current rating above which it prevents current from passing to its associated capacitor; and (b) providing a voltage to an input of said capacitor circuit so that a current runs therethrough that exceeds the current rating of a designated number of said fuses, wherein the capacitor associated with each designated fuse is electronically eliminated in order to attain said desired total capacitance for said capacitor circuit.

2. The method of claim 1, wherein said voltage varies over time.

3. The method of claim 2, wherein said voltage is programmed to progressively increase at designated time intervals.

4. The method of claim 2, wherein said voltage is pulsed.

5. The method of claim 2, wherein said voltage is an RF voltage.

6. The method of claim 1, wherein the current rating of said fuses progressively increases from a minimum current rating for that fuse positioned adjacent said input to a maximum current rating for that fuse positioned furthest from said input.

7. The method of claim 1, wherein said voltage is provided only once to said circuit input.

8. The method of claim 1, wherein each of said capacitors have the same capacitance.

9. The method of claim 1, wherein at least one of said capacitors has a capacitance different than the capacitance of the other capacitors.

10. The method of claim 1, wherein said desired total capacitance is a function of the capacitors remaining in said circuit after providing said voltage to said circuit input.

11. A method of electronically tuning a capacitor circuit having a plurality of capacitors connected in parallel relation so that a desired total capacitance for said capacitor circuit is attained, each capacitor having a unique breakdown voltage/current ranging from a minimum breakdown voltage/current for that capacitor positioned adjacent an input to said capacitor circuit to a maximum breakdown voltage/current positioned furthest from said input, comprising the step of provdng a voltage to said input of said capacitor circuit which exceeds the breakdown voltage/current of a designated number of said capacitors, wherein said designated capacitors are electronically eliminated, whereby said desired total capacitance is a function of the capacitors remaining after said voltage is provided to said circuit input.

12. The method of claim 11, wherein said voltage varies over time.

13. The method of claim 11, wherein said voltage is constant.

14. The method of claim 11, wherein said voltage is programmed to progressively increase at designated time intervals.

15. The method of claim 12, wherein said voltage is a Direct Current voltage.

16. The method of claim 12, wherein said voltage is pulsed.

17. The method of claim 12, wherein said voltage is an RF voltage.

18. The method of claim 11, wherein said voltage is provided only once to said circuit input.

19. The method of claim 11, wherein each of said capacitors has the same capacitance.

20. The method of claim 11, wherein at least one of said capacitors has a capacitance different than the capacitance of said other capacitors.

* * * * *